United States Patent [19]

Fishman et al.

[11] Patent Number: 4,678,169

[45] Date of Patent: Jul. 7, 1987

[54] PRINTED CIRCUIT BOARD HOLDER

[75] Inventors: Herbert Fishman, Newton Center; Alvin J. Rogers, Brockton, Mass.

[73] Assignee: Systems Engineering & Manufacturing Corp., Stoughton, Mass.

[21] Appl. No.: 882,182

[22] Filed: Jul. 7, 1986

Related U.S. Application Data

[63] Continuation of Ser. No. 565,860, Dec. 27, 1983, abandoned, which is a continuation-in-part of Ser. No. 455,956, Jan. 6, 1983, Pat. No. 4,454,003.

[51] Int. Cl.$^4$ ............................................. B23Q 1/00
[52] U.S. Cl. .................................... 269/46; 211/113; 269/903; 118/503
[58] Field of Search ............................. 118/500–503; 211/41, 113, 118; 269/46, 296, 152, 251, 903

[56] References Cited

U.S. PATENT DOCUMENTS

| | | | |
|---|---|---|---|
| 1,567,269 | 12/1925 | Hoya | 269/46 |
| 1,945,572 | 2/1934 | Sandbrook | 118/503 |
| 2,057,569 | 10/1936 | Goodwillie | 269/46 |
| 2,343,490 | 3/1944 | White | 269/46 |
| 2,480,415 | 8/1949 | Mettler | 269/251 |
| 2,634,450 | 4/1953 | Britton | 269/46 |
| 4,454,003 | 6/1984 | Fishman et al. | 118/501 |

Primary Examiner—Robert C. Watson
Attorney, Agent, or Firm—Wolf, Greenfield & Sacks

[57] ABSTRACT

A holder for supporting a printed circuit board in a vertical plane for movement along a path for treatment of sides of the board. The holder comprises a rigid frame support an means for mounting the frame for movement along the path. The improvement comprises means for mounting an edge of the board at a first position on the frame and a moveable weight bar for mounting a second edge of the board at a second position on the frame below the first position. The weight bar acts to provide a stretching force to the board for aiding and maintaining the board substantially planar during processing of the board as mounted in the frame.

14 Claims, 7 Drawing Figures

PRINTED CIRCUIT BOARD HOLDER

RELATED APPLICATION

This application is a continuation of application Ser. No. 565,860 filed 12-27-83 now abandoned which in turn is a continuation in part of application Ser. No. 455,956 filed Jan. 6, 1983 now U.S. Pat. No. 4,454,003.

BACKGROUND OF THE INVENTION

The present invention relates in general to printed circuit board conveyor apparatus. More particularly, the invention relates to an improved form of holder for a printed circuit board as used in such apparatus.

Printed circuit boards have come into increasing use in the electronics industry. Particularly with miniaturization, the need for high speed efficient and accurate processing of printed circuit board components has increased. Often the circuit board components start with a base sheet of insulating material which may have bound to one or both sides thereof a layer of copper. The base is often called a substrate and can take the form of epoxy, glass or various polymeric materials.

The processing steps on printed circuit board components are often carried out in conveyor apparatus along horizontal paths where various treating stations expose the board components to processing. These steps can be developing, rinsing-etching, rinsing-resist stripping-rinsing, black oxide coating, drying and the like.

Often apparatus for conveying and treating the printed circuit boards take up substantial manufacturing area space. Lines can run from ten to thirty feet in horizontal space. Problems sometimes arise in spray treating as in developing, etching, washing and stripping. The boards at stages of manufacture are often non-rigid and tend to wiggle when exposed to spray baths and the like. This can lead to non-uniformity in application of sprayed materials. The printed circuit board apparatus presented in the aforementioned copending application Ser. No. 455,956 for the most part overcomes all of the aforementioned problems but it is the intent of the present invention to provide in particular, a holder forming part of the conveying apparatus and which has improved stability so as to enable the proper carrying out of the processing steps to be conducted on the printed circuit board.

SUMMARY OF THE INVENTION

Accordingly, it is an object of the present invention to provide an improved holder for a conveyor apparatus which treats printed circuit board components rapidly and efficiently while the holder maintains both rigid and non-rigid boards in a substantially non-distorted configuration during treatment.

Another object of the present invention is to provide an improved holder for a conveyor apparatus used in the treating of printed circuit board components and which provides improved stability of the boards, particularly lateral stability. This lateral stability maintains the boards at the preferred predetermined distances from spray apparatus or the like located on either side of the boards.

A further object of the present invention is to provide an improved holder for a conveyor apparatus for holding printed circuit boards and which is adapted with a single size frame to accommodate a variety of sizes of boards. In this way, the conveying system does not have to have a number of different sizes of supporting frames or racks for each size board that is processed.

Still another object of the present invention is to provide an improved holder for printed circuit boards or the like used in a conveying system for the treatment of the boards and in which the holder is adapted for supporting more than one board therein.

To accomplish the foregoing and other objects of this invention there is provided, in a conveyor apparatus, conveying printed circuit boards, a frame for use in conveying at least one substantially planar printed circuit board component. This frame is adapted to provided support in a vertical plane and is adapted for movement along a path for treatment of sides of the board. The frame defines a rigid frame support and a means for mounting the frame for movement along the path of travel. The improvement in accordance with the present invention comprises means for mounting an edge of the board at a first position on the frame, and a movable weight bar means for mounting a second edge of the board at a second position on the frame below the first position. The weight bar acts to provide a stretching force by gravity to the board for aiding and maintaining the board substantially planar during the processing thereof. The weight bar is adapted for a sliding movement up and down in the frame and is thus adapted for use with boards of varying size. The means for mounting an edge of the board may comprise a plurality of hooks. The weight bar preferably carries a plurality of hooks also for engaging the board and for providing the weighted support at the bottom thereof. In an alternate embodiment of the present invention, the frame is adapted to support multiple boards, preferably in a vertical stack. In the disclosed embodiment, two such boards are mounted. The weight bar associated with the upper board and disposed suspended from the bottom of the upper board also functions as a support means for the top of the lower board. There is also provided a second weight bar at the bottom of the lower board. Thus, for the use of two printed circuit boards, there are two associated weight bars, each of which is captured at its ends in the frame so as to prevent any lateral instability.

BRIEF DESCRIPTION OF THE DRAWINGS

Numerous other objects, features and advantages of the invention should now become apparent upon a reading of the following detailed description taken in conjunction with the accompanying drawings, in which.

DETAILED DESCRIPTION

Figure 6:
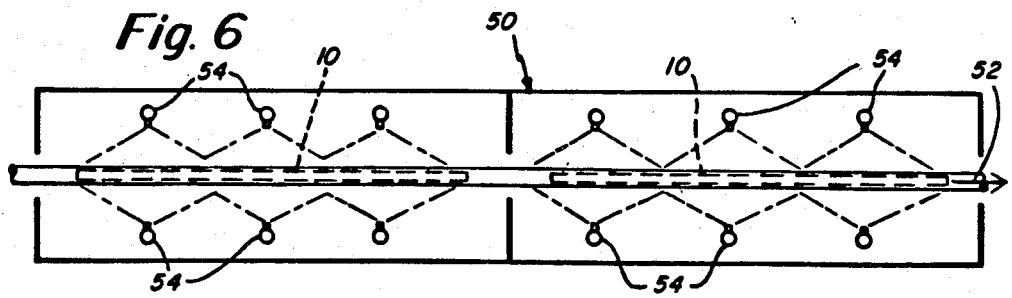
FIG. 6 schematically represents the holder in relationship to the processing station.
Figure 7:
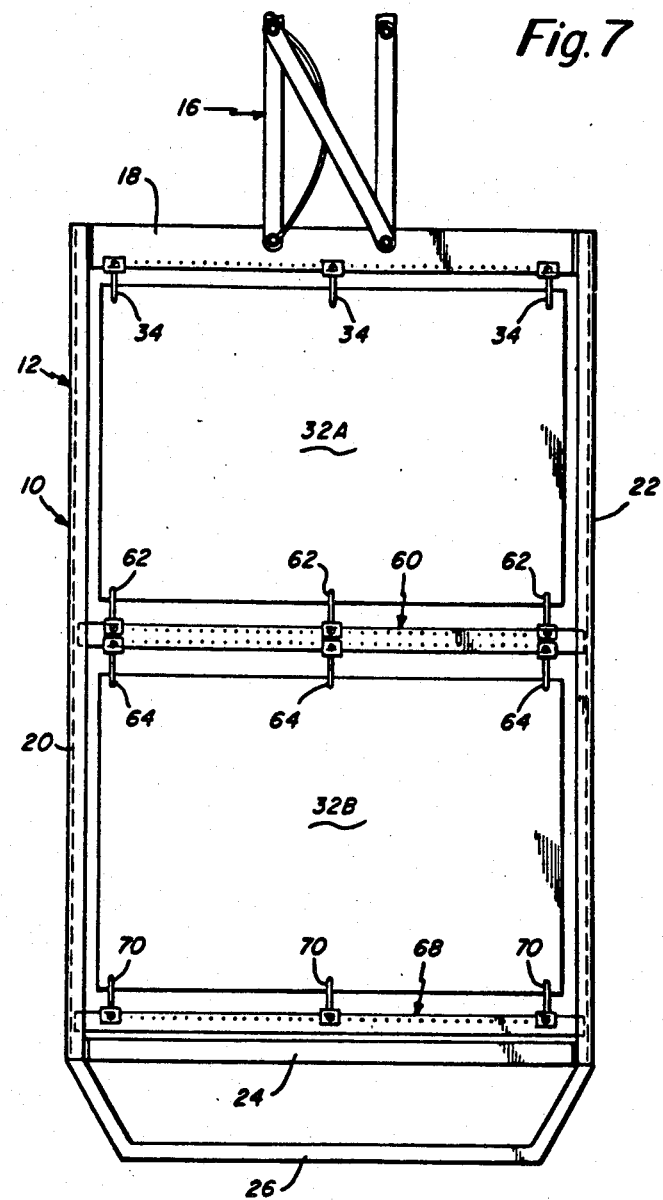
FIG. 7 is a side elevation view of an alternate embodiment of a holder in accordance with the invention.

With reference to the drawings, one embodiment of the present invention is illustrated in FIGS. 1-5. FIG. 6 is a schematic view illustrating the manner in which the conveyor system frames progress through a processing station which may be a spray station. FIG. 7 illustrates an alternate embodiment of the invention in which multiple boards are supported in frame.

With reference to FIGS. 1-5, there is shown a holder 10 which includes a frame 12 which is supported from a conveyor drive member 14. For this purpose there is provided a seriatum frame means 16 connected between the conveyor drive member 14 and the top frame piece 18.

Figure 3:
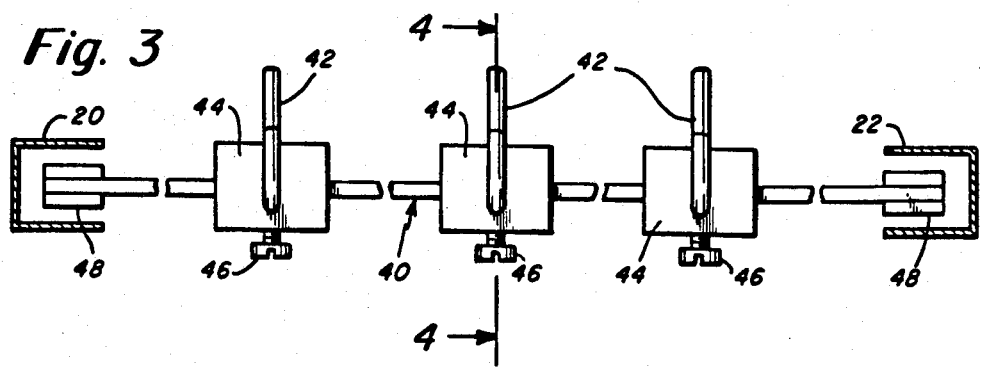
FIG. 3 is a cross-sectional view showing the weight bar in a plan view taken along line 3—3 of FIG. 1.
Figure 4:
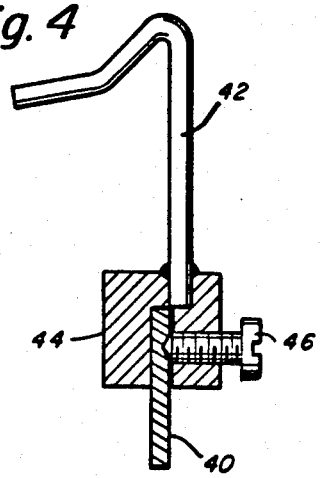
FIG. 4 is a more detailed cross-sectional view taken along line 4—4 of FIG. 3.
Figure 5:
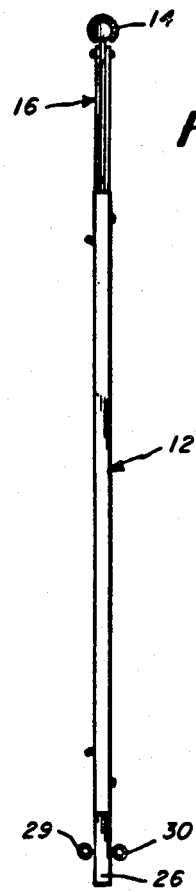
FIG. 5 is an end view of the holder of FIGS. 1-4.

The frame 12, in addition to and including the top frame piece 18, also has U-shaped side pieces 20 and 22. The cross-sectional shape of the side pieces is illustrated in FIG. 3. Frame 12 also has a bottom frame piece 24 and at the bottom of the frame 12 there is supported therefrom, the positioning blade 26.

Because of the desirability of the uniformity of spray, as illustrated in FIG. 6, it is desired that the frame itself be maintained substantially vertical and preferably sway very little from side to side as it moves along the track. This is accomplished by means of a conveyor guide means including guide rails 29 and 30. In this regard, refer to FIG. 5 which shows the blade section 26 of the frame supported between the guide rails 29 and 30. Thus, as each of the frames move along the conveying system, they are maintained in substantially vertical alignment by the blade 26 being positioned between the guide rails 29 and 30.

In an alternate embodiment in accordance with the invention, the blade 26 may be removed from the frame. This can be used in conveying systems in which there is not apt to be any substantial side movement of the frame.

Figure 1:
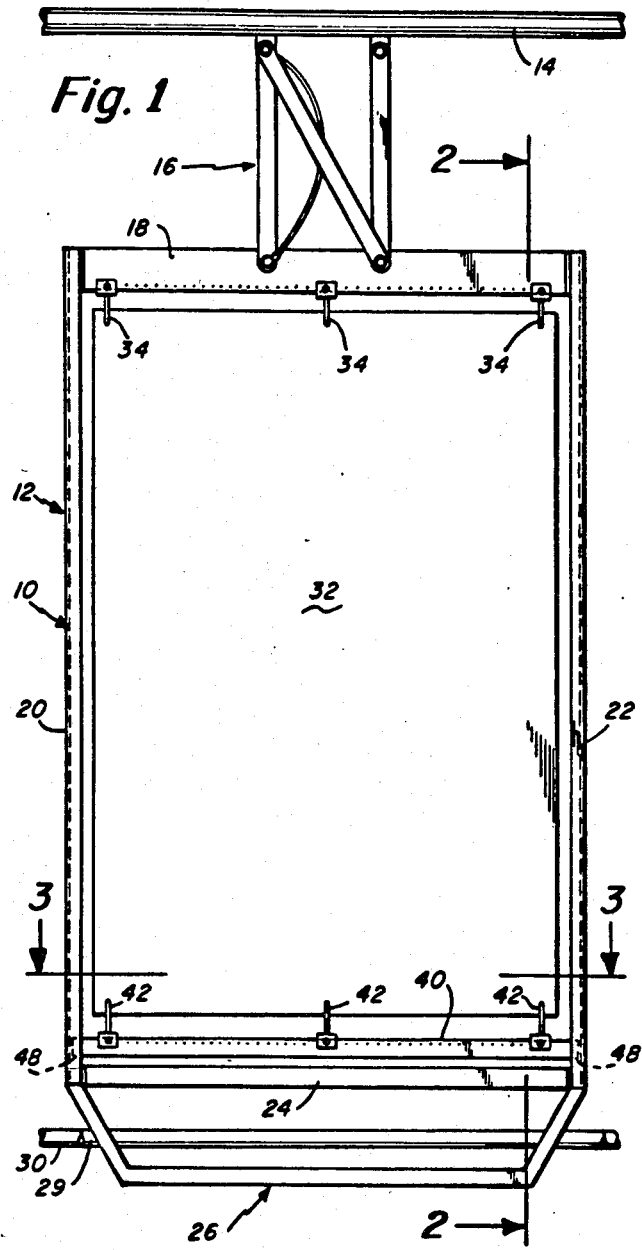
FIG. 1 is a side elevation view showing the frame holder of the present invention associated with a conveyor system for printed circuit boards.
Figure 2:
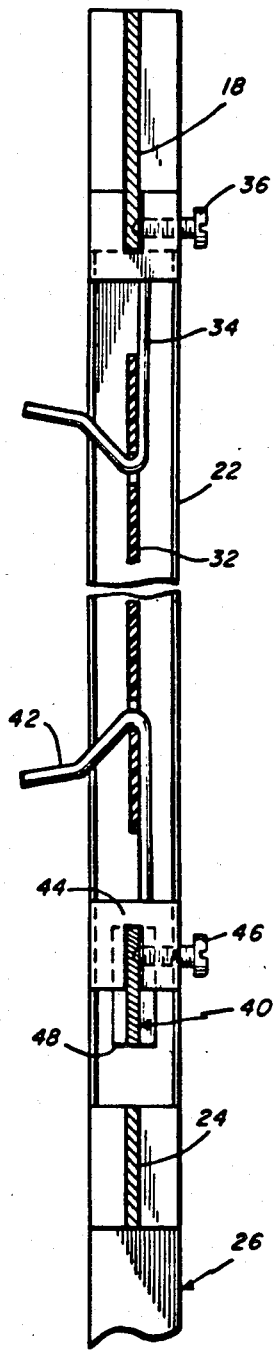
FIG. 2 is a cross-sectional view showing further detail and taken along line 2—2 of FIG. 1.

In the embodiment of FIGS. 1-5, the printed circuit board 32 is supported from the top frame piece 18 by means of a plurality of hooks 34. The configuration of the hook 34 is most clearly illustrated in FIG. 2. The hook 34 extends through a hole that is provided in the top of the printed circuit board 32. At the top, hook 34 is supported to the top frame piece 18 by means of a securing screw 36. As indicated in FIG. 1, the hooks 34 may be disposed at a number of different positions along the top frame piece 18. The hooks are positioned to correspond with holes that are provided at the top of the printed circuit board 32.

As in accordance with the invention, at the bottom of the printed circuit board 32 there is provided a weight bar 40. The weight bar 40 is supported from the printed circuit board 32 by support means which includes a plurality of hooks 42. Each of the hooks extend through a hole at the bottom of the printed circuit board and each of the hooks have a respective, adjustable support base 44. The support base 44 has associated therewith, respective securing screws 46. It is noted, for example, in FIG. 1 that the hooks 42 may be adjustably positioned at the number of different points along the weight bar 40. Again, the supporting hook members for the weight bar are positioned at a point to correspond with holes that are provided in the printed circuit board 32. It is also noted that the ends 48 of the weight bar 40 are enlarged and are adapted to be captured by the frame side pieces 20 and 22. Thus, the weight bar 40 not only provides a gravity stretching force on the printed circuit board, but it is also captured by means of the frame so as to prevent any lateral displacement of the printed circuit board 32 relative to the frame.

Another advantage of the weight bar is that it can be used in association with printed circuit boards of any size. In the illustration of FIG. 1, a maximum height printed circuit board is shown, but if printed circuit boards of lesser height were used, then the weight bar 40 can similarly be attached at a higher position than illustrated in FIG. 1 and the weight bar functions in substantially the same manner. The ends 48 of the weight bar still remain captured in the side pieces 20 and 22 of the frame 12.

FIG. 6 is for schematically illustrating the manner in which the holder 10 with its associated printed circuit board 32 progresses through a processing station 50. The frame holder is shown progressing in the direction of the arrow 52. Within the processing station 50, there is provided liquid spray means which are illustrated in the form of banks of spray heads 54 which provide a uniform spray of solution on to the printed circuit board components. Preferably both sides are sprayed in normal processing as in cleaning. It is important that the positioning remain constant from the spray heads to the board. The use of the improved frame of the present invention with or without the use of guide rail means provide proper distancing between the boards and the spray heads.

As far as the conveyor drive system is concerned, this may be of the form as more completely described in the aforementioned application Ser. No. 455,956 or may be of other type.

Reference is now also made to FIG. 7 which shows an alternate embodiment of the present invention used for the support of two printed circuit boards identified in FIG. 7 as boards 32A and 32B. Actually, in the embodiment of FIG. 7, like reference characters have been used to identify like parts previously mentioned in FIG. 1. The frame 12 illustrated in FIG. 7 is of substantially identical construction to the frame of FIG. 1. Thus, in accordance with one feature of the present invention, it is noted that even though different size boards are being processed, the same frame can be used regardless of the size of the boards. Also, the same frame can be used for supporting one, two, or possibly greater numbers of boards. In the embodiment of FIG. 7, two boards are shown as previously mentioned. The top board 32A is supported by support means in the form of hooks 34 as in the embodiment of FIG. 1. There is also provided a weight bar 16 supported by means of hooks 62 from the bottom end of the upper board 32A. The hooks 62 are of substantially identical construction to the hooks 34 and 42 illustrated in FIG. 1. However, in the embodiment of FIG. 7, the weight bar 60 is of somewhat larger dimension so that it can also support means for supporting from the weight bar 60, the lower printed circuit board 32. In FIG. 7, note the upper and lower series of holes which enable support of hook supports from either side or the weight bar 60. This includes the aforementioned upper hooks 62 and also a plurality of lower hooks 64. The lower hooks 64 support the top of the printed circuit board 32B. In order to provide a weight at the bottom of the bar 32B, there is also provided a second weight bar 68 which has hooks 70 supported therefrom. The hooks 70 engage with holes in the bottom of the lower printed circuit board 32B. Thus, the weight bar 68 is supported from the bottom of the printed circuit board 32B. Both of the weight bars 60 and 68 have their ends captured in the U-shaped cross-section side pieces 20 and 22 in the same manner as illustrated in connection with the first embodiment and in particular in FIG. 3.

Having now described a limited number of embodiments of the present invention, it should now be apparent to those skilled in the art that numerous other embodiments and modifications thereof are contemplated as falling within the scope of the invention. For example, in the preferred embodiment, hooks have been shown for the support of the printed circuit board and the weight bar. In an alternate embodiment, a clip arrangement could be used. Also, the floating weight bar is shown free sliding within a U-shaped frame but in an alternate embodiment, the weight bar itself could be U-shaped and could ride on vertical flap stock as part of the frame.

What is claimed is:

1. In a frame for use in conveying at least one substantially planar printed circuit board component in a vertical plane along a path for treatment of sides of said board, said frame defining a rigid frame support and means for mounting said frame for movement along said path, the improvement comprising;
   means for mounting an edge of said board at a first position on said frame,
   a moveable weight bar means for mounting a second edge of said board at a second position on said frame below said first position with said weight bar acting to provide a gravitational force on said board component for aiding in maintaining said component substantially planar during processing of said component mounted in said frame,
   said weight bar being mounted for reciprocal movement toward and away from the pull of gravity with the weight of the weight bar providing a gravitational force to restrain said board component,
   said weight bar having ends slidably inter-engageable with side pieces of said frame to further restrain said board component,
   said weight bar being supported relative to said frame so that substantially the full weight of the weight bar imposes a gravitational force on said board component.

2. The improvement of claim 1 including blade means on the bottom of said frame in sliding engagement with guide rail means.

3. The improvement of claim 2 and further comprising said weight bar carrying a plurality of hooks for engaging said component.

4. The improvement of claim 1 and wherein said frame has means for capturing ends of said weight bar means.

5. The improvement of claim 1 wherein the means for mounting at said first position includes adjustable support means.

6. The improvement of claim 5 wherein the means for mounting at said second position includes adjustable support means.

7. The improvement of claim 6 wherein both support means at first and second positions include a plurality of hooks.

8. The improvement of claim 1 wherein said frame has means defining guide ways to permit vertical sliding movement of said weight bar means.

9. The improvement of claim 1 wherein said board comprises a first board and further including means for supporting a second board below said first board in said frame.

10. The improvement of claim 1 including a second moveable weight bar means associated with said second board.

11. The improvement of claim 10 wherein the second lower board is supported from the weight bar of the first board.

12. In an apparatus for conveying a plurality of printed circuit boards along a first path, the improvement comprising,
   a frame carrying a printed circuit board,
   said frame defining an outer support perimeter,
   a top hanger section and a lower blade section with said board being substantially arranged in a plane,
   said frame carrying means for supporting a planar printed circuit board component in releasable engagement therewith while being mounted to prevent movement of said board from a predetermined plane while exposed to a plurality of processing conditions,
   and a moveable weight bar means for mounting a lower edge of said board at a position on said frame below the board support position with the weight bar acting to provide a gravitational force on said board component for aiding and maintaining said component substantially planar during processing of said component,
   said weight bar being mounted for reciprocal movement toward and away from the pull of gravity with the weight of the weight bar providing a gravitational force to restrain said board component,
   said weight bar having ends freely and slidably inter-engageable with lower disposed members of said frame to further restrain said board component,
   said weight bar being supported relative to said frame so that substantially the full weight of the weight bar imposes a gravitational force on said board component.

13. A frame for use in conveying a plurality of printed circuit boards vertically arranged along a path,
   said frame defining an outer support perimeter,
   a top hanger section and a lower blade section with said board being substantially arranged in a plane,
   said frame carrying means for supporting a planar printed circuit board component in releasable engagement therewith while said board is mounted to prevent movement of the board from a predetermined plane while exposed to a plurality of processing conditions,
   said lower blade section being adapted to move along a straight line path in sliding engagement with a guide rail,
   and a moveable weight bar means for mounting a lower edge of said board at a position on said frame below the board support position with the weight bar acting to provide a gravitational force on said board component for aiding and maintaining said component substantially planar during processing of said component,
   said weight bar being mounted for reciprocal movement toward and away from the pull of gravity with the weight of the weight bar providing a gravitational force to restrain said board component,
   said weight bar having ends freely and slidably inter-engageable with lower disposed members of said frame to further restrain said board component, said weight bar being supported relative to said frame so that substantially the full weight of the weight bar imposes a gravitational force on said board component.

14. A printed circuit board conveyor apparatus in accordance with claim 2 wherein said frame means comprising a generally rectangular frame having an extension portion adapted to be positioned between first and second guide rails and a hanger section opposite said blade portion.

* * * * *